United States Patent [19]

Imai

[11] Patent Number: 4,762,809
[45] Date of Patent: Aug. 9, 1988

[54] LOW DIELECTRIC FIBER GLASS COMPOSITION HAVING IMPROVED WATER RESISTANCE AND HEAT RESISTANCE

[75] Inventor: Katsuhiko Imai, Shiga, Japan

[73] Assignee: Nippon Electric Glass Company, Limited, Shiga, Japan

[21] Appl. No.: 64,816

[22] Filed: Jun. 19, 1987

[30] Foreign Application Priority Data

Jun. 20, 1986 [JP]  Japan ................................ 61-145457

[51] Int. Cl.[4] ............................................. C03C 13/00
[52] U.S. Cl. ........................................ 501/35; 501/55; 501/66; 264/DIG. 19
[58] Field of Search .................. 501/35, 55, 65, 66

[56] References Cited

U.S. PATENT DOCUMENTS 4,097,258 6/1978 Horikawa et al. ................. 501/77 X

FOREIGN PATENT DOCUMENTS 954836 6/1960 United Kingdom .................. 501/35

OTHER PUBLICATIONS

"Handbook of Fillers and Reinforcements for Plastics", Van Nostrand Reinhold Co. pp. 480–481.
"Handbook of Glass Data", O. Mazurin et al., Elseuier Pub. pp. 571, 597.
"Technology of Glass and Ceramics", J. Hlavac, Elsevier Pub. pp. 186–188.

*Primary Examiner*—William R. Dixon, Jr.
*Assistant Examiner*—Andrew B. Griffis
*Attorney, Agent, or Firm*—Kurt Kelman

[57] ABSTRACT

A $SiO_2$13 $B_2O_3$ fiber glass composition is disclosed which contains a reduced amount of $B_2O_3$ in comparison with conventional D glass to thereby improve the water resistance and heat resistance. The fiber glass composition of the present invention has a dielectric constant of 4.5 or less for 1 MHz at the room temperature, a strain point of 485° C. or more, and improved water resistance. The composition consists essentially of, by weight $SiO_2$ 70–80%, $Al_2O_3$ 0–2.0%, $B_2O_3$ 15.0–21.5%, $MgO$ 0–1.0%, $CaO$ 0–2.0%, $Li_2O$ 0–2.0%, $Na_2O$ 0–3.0%, and $K_2O$ 0–3.0%, $Li_2O+Na_2O+K_2O=2.0–5.0\%$.

2 Claims, No Drawings

LOW DIELECTRIC FIBER GLASS COMPOSITION HAVING IMPROVED WATER RESISTANCE AND HEAT RESISTANCE

BACKGROUND OF THE INVENTION

1. Field of the Invention

The present invention relates to a fiber glass composition and, in particular, to a glass composition for glass fibers adaptable for use in reinforcement of printed wiring boards.

2. Description of the Prior Art

Among various types of the glass fiber, a so called "E" glass fiber has been used in the electrical or electronic technical field, for example, for printed wiring boards, because of its unique electrical insulation properties, as disclosed by G. N. Bolen in the MANUFACTURE OF GLASS-FIBER YARNS FOR PRINTED WIRING BOARDS, 29th National SAMPE Symposium, Apr. 3–5, 1984.

A kind of E fiber glass is disclosed in U.S. Pat. No. 2,334,961 by Schoenlaub, which consists, by weight, of $SiO_2$ 52–56%, $Al_2O_3$ 12–16%, CaO 16–19%, MgO 3–6%, and $B_2O_3$ 9–11%.

U.S. Pat. No. 2,571,074 by Tiede et al discloses another kind of E glass which consists, by weight, of $SiO_2$ 52–56%, $Al_2O_3$ 12–16%, CaO 19–25%, and $B_2O_3$ 8–13%.

However, a printed wiring board using E glass fiber is not proper for use in high speed digital signal processing devices because it has a high dielectric constant (about 5.5) which causes unacceptable signal propagation time.

As another type of glass fiber having an improved dielectric constant, a so called "D" glass fiber is disclosed in the "Handbook of Fillers and Reinforcements for Plastics", published by VAN NOSTRAND REINHOLD COMPANY, p.p. 480 and 481, and consists, by weight, of $SiO_2$ 74.5%, $Al_2O_3$ 0.3%, $B_2O_3$ 22.0%, CaO 0.5%, $Li_2O$ 0.5%, $Na_2O$ 1.0%, and $K_2O$ 1.5%. The D glass fiber has a dielectric constant of 3.56 for $10^6$ Hz, at 72° F.

Although the D glass fiber has a desirable dielectric constant, it has a problem in that it is not water proof or water resistant. That is, the D glass has a low resistance to water and the alkaline elements are eluted into the water. Accordingly, the D glass fiber exhibits low adhesion to plastic resin so that the reliability of a printed wiring board using the D glass is degraded.

Further, the D glass fiber has a low strain point of about 470° C. and is, therefore, has a low resistance to heat. The glass fiber is heat-treated at 380° C. for 72 hours to fire the binder adhered to the fiber prior to application into the printed wiring board. At that time, the D glass fiber is apt to deteriorate because of its low strain point.

SUMMARY OF THE INVENTION

Therefore, it is an object of the present invention to provide a fiber glass composition which has improved water-resistance, alkali elution, and strain point, with a dielectric constant nearly equal to the conventional D glass fiber.

According to the present invention, a fiber glass composition is obtained which has dielectric constant of 4.5 or less for 1 MHz at room temperature, a strain point of 485° C. or more, and improved water resistance. This fiber glass composition consists essentially, by weight, of $SiO_2$ 70–80%, $Al_2O_3$ 0–2.0%, $B_2O_3$ 15.0–21.5%, MgO 0–1.0%, CaO 0–2.0%, $Li_2O$ 0–2.0%, $Na_2O$ 0–3.0%, and $K_2O$ 0–3.0%, $Li_2O + Na_2O + K_2O = 2.0$–5.0%.

A preferable glass composition consists essentially, by weight, of $SiO_2$ 73.0–78.0%, $Al_2O_3$ 0–1.0%, $B_2O_3$ 18.0–21.0%, MgO 0–0.5%, CaO 0–1.0%, $Li_2O$ 0–1.0%, $Na_2O$ 0–2.0%, and $K_2O$ 0–2.0% $Li_2O + Na_2O + K_2O = 2.5$–4.5%.

The manufacture of glass fiber products according to the glass composition of the present invention can be carried out according to a conventional production method well known in the prior art. For example, a production method as disclosed in the above-described MANUFACTURE OF GLASS FIBER YARNS FOR PRINTED WIRING BOARDS, p.p. 1361–1362, may be used.

The glass composition of the present invention contains 70.0–80.0% by weight. Use of $SiO_2$ more than 80.0% $SiO_2$ increases viscosity at an elevated temperature so that the glass is difficult to melt. When the amount of $SiO_2$ is lower than 70.0%, water resistance of the glass is low.

$Al_2O_3$ is an element used for suppressing phase separation of the glass and for improving the water resistance. Use of more than 2.0% of $Al_2O_3$ undesirably raises the dielectric constant.

$B_2O_3$ is an element used for reducing the viscosity of the glass and for making it easy to melt the glass. When the amount of $B_2O_3$ is lower than 15.0%, this effect is not obtained. When $B_2O_3$ exceeds 21.5%, the water resistance and the strain point are lowered.

The present invention attempts to use a reduced amount of $B_2O_3$ in comparison with the known D glass to thereby obtain the improved water and heat resistance.

MgO and CaO are included as elements for elevating the strain point of the glass. Inclusion of more than 1% MgO and more than 2% CaO results in an undesirable increase in the dielectric constant.

$Li_2O$ is also an element for reducing the viscosity of the glass, for making it easy to melt the glass, and for elevating the strain point. Use of more than 2% $Li_2O$ makes the dielectric constant undesirably high. Further, it is uneconomical to include a large amount of $Li_2O$ because it is expensive.

$Na_2O$ and $K_2O$ are also used for making it easy to melt the glass. Inclusion of more than 3% of each of them degrades the water resistance of the glass.

When the total amount of $Li_2O$, $Na_2O$, and $K_2O$ is less than 2%, the resultant glass has a high viscosity at an elevated temperature and is difficult to melt. When the total amount is more 5%, the dielectric constant is more than 4.5 which is undesirable.

The fiber glass of the present invention can include a refining element or elements such as $As_2O_3$, $Sb_2O_3$, NaCl, $Na_2SO_4$, $CaF_2$, and other fluorides, or an impurity or impurities such as $Fe_2O_3$ and $TiO_2$, if the included amount is 2% or less by weight.

EXAMPLES

Examples of the present invention will be described below in comparison with a known D glass sample.

Each sample glass fiber of Nos. 1–11 in Tables 1 and 2 was produced in the following manner.

TABLE 1

| Sample No. | 1 | 2 | 3 | 4 | 5 | 6 |
|---|---|---|---|---|---|---|
| $SiO_2$ (wt %) | 74.6 | 75.1 | 76.4 | 75.3 | 75.0 | 74.8 |
| $Al_2O_3$ (wt %) | 1.0 | — | 1.0 | — | 0.8 | — |
| $B_2O_3$ (wt %) | 20.0 | 21.0 | 18.4 | 20.5 | 20.8 | 20.5 |
| MgO (wt %) | 0.5 | 0.3 | 0.2 | 0.4 | 0.1 | — |
| CaO (wt %) | 0.4 | 1.0 | 0.8 | 0.6 | — | 1.0 |
| $Li_2O$ (wt %) | 0.5 | 0.4 | 0.6 | 0.6 | 0.8 | 0.6 |
| $Na_2O$ (wt %) | 2.0 | 0.9 | 1.1 | 1.1 | 0.5 | 1.3 |
| $K_2O$ (wt %) | 1.0 | 1.3 | 1.5 | 1.5 | 2.0 | 1.8 |
| Dielectric constant (1 MHz) | 4.4 | 4.1 | 4.4 | 4.3 | 4.2 | 4.4 |
| Eluted alkali amount $R_2O$ (R = Li, Na, K) mg | 0.15 | 0.28 | 0.25 | 0.30 | 0.20 | 0.1 |
| Strain point (°C.) | 505 | 495 | 515 | 500 | 502 | 505 |

TABLE 2

| Sample No. | 7 | 8 | 9 | 10 | 11 |
|---|---|---|---|---|---|
| $SiO_2$ (wt %) | 75.9 | 77.8 | 76.1 | 77.2 | 74.2 |
| $Al_2O_3$ (wt %) | 0.4 | 0.2 | 0.6 | 0.1 | 0.3 |
| $B_2O_3$ (wt %) | 19.3 | 18.8 | 20.8 | 19.8 | 22.0 |
| MgO (wt %) | 0.5 | 0.4 | — | 0.2 | — |
| CaO (wt %) | — | 0.3 | — | 0.2 | 0.5 |
| $Li_2O$ (wt %) | 0.4 | 0.2 | 0.9 | 1.0 | 0.5 |
| $Na_2O$ (wt %) | 2.0 | 2.0 | 0.8 | 0.8 | 1.0 |
| $K_2O$ (wt %) | 1.5 | 0.3 | 0.8 | 0.7 | 1.5 |
| Dielectric constant (1 MHz) | 4.5 | 4.1 | 4.1 | 4.1 | 4.1 |
| Eluted alkali amount $R_2O$ (R = Li, Na, K) mg | 0.23 | 0.19 | 0.17 | 0.20 | 0.45 |
| Strain point (°C.) | 510 | 495 | 505 | 520 | 473 |

The batch was weighed in the amounts as shown in each Tables 1 and 2 and mixed as powders. The mixture was melted in a platinum crucible at about 1,550° C. for about 16 hours.

A part of the molten glass was poured onto a graphite plate to form a glass plate. The glass plate was annealed in a furnace and both surfaces of the glass plate were then polished. Thus, a test piece having a dimension of 50 mm×50 mm×3 mm was obtained. The dielectric constant of the test piece was measured for 1 MHz at the room temperature.

The remaining part of the molten glass was used for measuring the alkali elution and the strain point.

The molten glass was crushed into powder by putting it into water, and the glass powder was subjected to an alkali elution test determined in the JIS (Japanese Industrial Standard) R 3502-1958 (reaffirmed: 1983).

The measurement of the strain point was carried out according to the ASTM C 336-71.

The measured dielectric constant, eluted alkali amount, and strain point of each sample glass Nos. 1-11 are shown in Table 1 and 2.

As shown in Tables 1 and 2, the glass samples Nos. 1-10 according to the present invention have a dielectric constant nearly equal to the known D glass sample No. 11. However, the eluted alkali amount is 0.15-0.30 mg for samples Nos. 1-10 according to the present invention but 0.45 for the known D glass sample No. 11. Therefore, the glass fiber according to the present invention is superior to the known D glass fiber in the water resistance. Further, the strain point (about 495°-520° C.) of each sample Nos. 1-10 according to the present invention is higher than that (473° C.) of the known D glass sample No. 11. That is, the glass fiber according to the present invention also has an improved heat resistance.

What is claimed is:

1. A fiber glass composition having dielectric constant of 4.5 or less for 1 MHz at the room temperature, a strain point of 485° C. or more, and improved water resistance, and consisting essentially of, by weight, $SiO_2$ 70-80%, $Al_2O_3$ 0-2%, $B_2O_3$ 15.0-21.5%, MgO 0-1.0%, CaO 0-2.0%, $Li_2O$ 0-2.0%, $Na_2O$ 0-3.0%, and $K_2O$ 0-3.0%, $Li_2O + Na_2O + K_2O = 2.0-5.0\%$.

2. A fiber glass composition as claimed in claim 1, wherein said glass composition consists essentially of, by weight, $SiO_2$ 73.0-78.0%, $Al_2O_3$ 0-1.0%, $B_2O_3$ 18.0-21.0%, MgO 0-0.5%, CaO 0-1.0%, $Li_2O$ 0-1.0%, $Na_2O$ 0-2.0%, and $K_2O$ 0-2.0%, $Li_2O + Na_2O + K_2O = 2.5-4.5\%$.

* * * * *